(12) United States Patent
Bertin

(10) Patent No.: US 10,018,654 B2
(45) Date of Patent: Jul. 10, 2018

(54) SENSOR CIRCUIT FOR DETECTING ROTATION OF AN OBJECT AND METHOD THEREFOR

(71) Applicant: SEMICONDUCTOR COMPONENTS INDUSTRIES, LLC, Phoenix, AZ (US)

(72) Inventor: Jacques Bertin, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 555 days.

(21) Appl. No.: 14/533,742

(22) Filed: Nov. 5, 2014

(65) Prior Publication Data

US 2015/0130451 A1    May 14, 2015

Related U.S. Application Data

(60) Provisional application No. 61/903,924, filed on Nov. 13, 2013.

(51) Int. Cl.
*G01B 7/30* (2006.01)
*G01R 3/00* (2006.01)
(Continued)

(52) U.S. Cl.
CPC ............ *G01R 3/00* (2013.01); *G01D 5/2258* (2013.01); *G01D 5/2266* (2013.01); *G01R 33/0017* (2013.01); *Y10T 29/49117* (2015.01)

(58) Field of Classification Search
CPC ...... G01K 3/00; G01D 5/2258; G01D 5/2266; G01D 5/145; G01R 3/0017; G01P 3/487
(Continued)

(56) References Cited

U.S. PATENT DOCUMENTS

| 4,855,734 A * | 8/1989 | Elsdoerfer | G01D 5/2066 318/661 |
| 5,065,095 A * | 11/1991 | Suzuki | G01D 5/243 324/207.25 |

(Continued)

OTHER PUBLICATIONS

Jaquet Technology Group, "DSH 16, Dual Channel Eddy Current Speed Sensor for Railway Applications, compliant with EN 50155," Technical Information, Version 07.14, undated.

*Primary Examiner* — Tung X Nguyen
*Assistant Examiner* — Dominic Hawkins
(74) *Attorney, Agent, or Firm* — Robert F. Hightower

(57) ABSTRACT

In one embodiment, a sensor circuit may include a first receiver circuit that may be configured to receive a first signal that is representative of a first mutual inductance and form a first detection signal that is representative of the first mutual inductance, wherein the first variable mutual inductance varies in response to a position of a metal object. An embodiment may include a second receiver circuit configured to receive a second signal that is representative of a second mutual inductance and form a second detection signal that is representative of the second mutual inductance, wherein the second mutual inductance varies in response to the position of the metal object. In an embodiment, the sensor circuit may include a recognition circuit configured to assert a movement detected signal responsively to a first value of the first detection signal, configured to assert a movement direction signal responsively to a first value of the second detection signal.

20 Claims, 7 Drawing Sheets

(51) Int. Cl.
*G01R 33/00* (2006.01)
*G01D 5/22* (2006.01)

(58) Field of Classification Search
USPC .................................................. 324/207.25
See application file for complete search history.

(56) References Cited

U.S. PATENT DOCUMENTS

| | | | | |
|---|---|---|---|---|
| 5,304,926 A * | 4/1994 | Wu | ........................ | G01D 5/147 324/207.2 |
| 6,043,644 A | 3/2000 | de Coulon et al. | | |
| 6,492,911 B1 * | 12/2002 | Netzer | ................. | G01D 5/2415 318/662 |
| 6,566,862 B1 * | 5/2003 | Goto | .................... | G01D 3/0365 324/207.16 |
| 7,132,825 B2 * | 11/2006 | Martin | ................. | G01D 5/2013 324/207.17 |
| 7,279,890 B2 * | 10/2007 | Matsuura | ................. | G01D 3/08 324/207.17 |
| 8,421,447 B2 * | 4/2013 | Inoue | ..................... | G01B 7/003 324/207.16 |
| 8,736,259 B2 * | 5/2014 | Manabe | ................ | G01D 5/2073 324/207.25 |
| 2002/0153879 A1 * | 10/2002 | Muraji | .................... | G01D 5/145 324/207.2 |
| 2005/0024006 A1 * | 2/2005 | Blossfeld | ............ | G01D 5/24476 318/653 |
| 2008/0048997 A1 * | 2/2008 | Gillespie | ............. | G06F 3/03547 345/174 |
| 2009/0021248 A1 | 1/2009 | Bernard et al. | | |
| 2011/0109304 A1 * | 5/2011 | Suzuki | .................... | H02K 24/00 324/207.25 |
| 2011/0227567 A1 * | 9/2011 | Reidmueller | ........... | G01D 5/145 324/244 |
| 2012/0303305 A1 | 11/2012 | Bergqvist et al. | | |
| 2013/0271122 A1 * | 10/2013 | Kino | ........................ | G01B 7/30 324/207.25 |
| 2014/0002065 A1 * | 1/2014 | Gustafsson | ........... | G01D 5/2073 324/207.25 |

* cited by examiner

SENSOR CIRCUIT FOR DETECTING ROTATION OF AN OBJECT AND METHOD THEREFOR

PRIORITY CLAIM TO PRIOR PROVISIONAL FILING

This application claims priority to prior filed Provisional Application No. 61/903,924 entitled "POSITIONAL AND ROTATION DIRECTION SENSOR AND METHOD THEREFOR" filed on Nov. 13, 2013, and having common inventor Jacques Bertin which is hereby incorporated herein by reference.

BACKGROUND OF THE INVENTION

The present invention relates, in general, to electronics, and more particularly, to semiconductors, structures thereof, and methods of forming semiconductor devices.

In the past, the electronics industry various methods and structures to form position sensors. In some applications such as for example for a crankshaft or camshaft of an internal combustion engine or other rotational machine, it may have been desirable to determine the position and direction of rotation of the crankshaft or camshaft or other rotating element. In some applications, a Hall Effect sensor was used to sense the position. In some applications, the sensor and the sensor interface could was implemented in an IC packaged with a permanent magnet. The IC could have been connected on a PCB with few extra devices. In some applications, the cost of the sensor was higher than desired. In some applications, the cost of the permanent magnet could be higher than was desired.

In some systems, electro-magnetic interference or noise from external to sensor could interfere with proper operation of the sensors.

Accordingly, it is desirable to have a sensor and method that reduces costs and/or that improves performance in the presence of noise.

Figure 1:
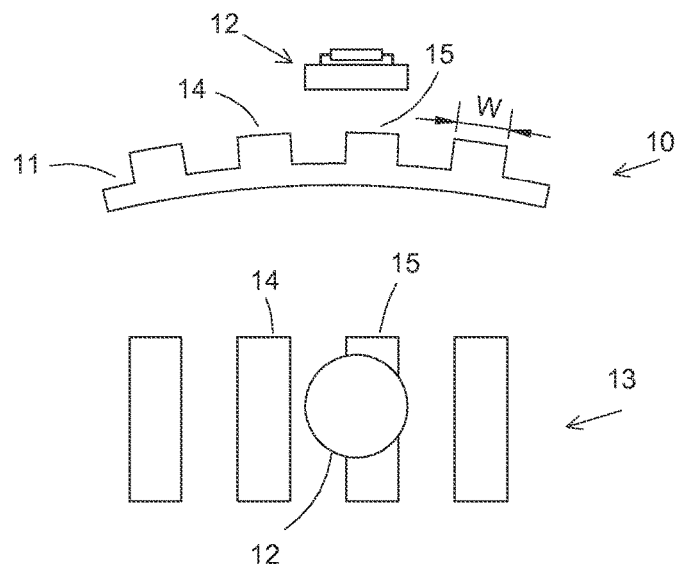
FIG. 1 illustrates one example of an embodiment of a portion of a rotational system that includes a proximity sensor system and movable object in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

FIG. 1 illustrates one example of an embodiment of a portion of a rotational system 10 that includes a proximity sensor system 12 and movable object. In some embodiments, the movable object may be a wheel 11 that has protrusions. In one embodiment, the protrusions may be teeth such as teeth of a gear that may be used to drive rotation of wheel 11. A top view 13 also illustrates proximity sensor system 12 and wheel 11 along with teeth 14 and 15. As will be seen further hereinafter, sensor system 12 includes sensor elements and a sensor circuit that can be used to determine if wheel 11 is moving and the direction of the movement.

Figure 2:
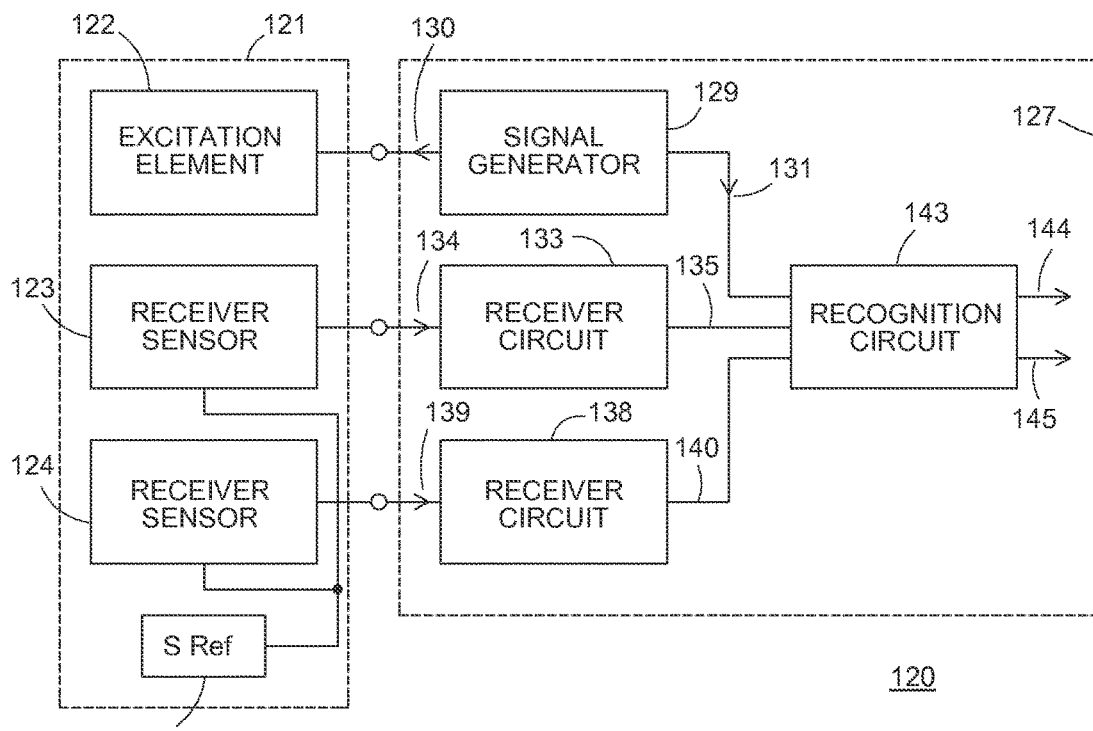
FIG. 2 schematically illustrates an example of an embodiment of a portion of sensing system that may be an embodiment of a portion of the system FIG. 1 in accordance with the present invention.

FIG. 2 schematically illustrates an example of an embodiment of a portion of sensing system 120 that may be an embodiment of a portion of system 12 of FIG. 1. An embodiment of system 120 includes a sensor circuit 127 and sensor elements 121. An embodiment of sensor circuit 127 may include a first receiver circuit 133 that is configured to receive a first signal 134 that is representative of a first variable mutual inductance of a sensor 123 and form a first detection signal 135 that is representative of the first variable mutual inductance. In an embodiment, signal 134 may be a differential a.c. signal received form sensor 123 and signal 135 may be a differential a.c. signal that swings around a common mode voltage. The common mode voltage may be ground or some other voltage value. Alternately, signal 135 may be a rectified d.c. signal that is referenced to a common voltage such as for example a ground reference. An embodiment may include that the first variable mutual inductance varies in response to a position of a target object. The target object may be a metal object. In some embodiments the target object may be a ferromagnetic material or alternately may be a conductive material. In an embodiment, circuit 127 may also include a recognition circuit 143 that is configured to assert a movement detected signal 144 responsively to a first value of first detection signal 135. For example, circuit 143 may form signal 144 to have an asserted value in response to the value of signal 135 being greater than a first threshold signal. Another embodiment of circuit 127 may include a signal generator circuit 129 that is configured to generate an excitation signal 130. Circuit 127 may be configured to apply excitation signal 130 to an excitation element 122. In an embodiment, the first variable mutual inductance may be formed between excitation element 122 and a first receiver sensor 123 that is configured to form signal 134. An embodiment of circuit 127 may also include a second receiver circuit 138 configured to receive a second signal 139 that is representative of a second variable mutual inductance and form a second detection signal 140 that is representative of the second variable mutual inductance. In an embodiment, signal 139 may be a differential a.c. signal received from sensor 124 that swings around a common mode voltage and signal 140 may be a differential a.c. signal that swings around the common mode voltage. The common mode voltage may be ground or some other voltage value. Alternately, signal 135 may be a rectified d.c. signal that is referenced to a common voltage such as for example a ground reference. An embodiment may include that the second variable mutual inductance varies in response to the position of the target object. An embodiment may include that the second variable mutual inductance may be formed between excitation element 122 and a second receiver sensor 124 that is configured to form signal 139. An embodiment may include that receiver sensors 123 and 124 may form signals that may be referenced to a common signal or sensor reference signal received from a sensor reference circuit or sensor reference or SRef 127. In an embodiment, circuit 143 may also be configured to assert a movement direction signal 145 responsively to a first value of second detection signal 140.

Figure 3:
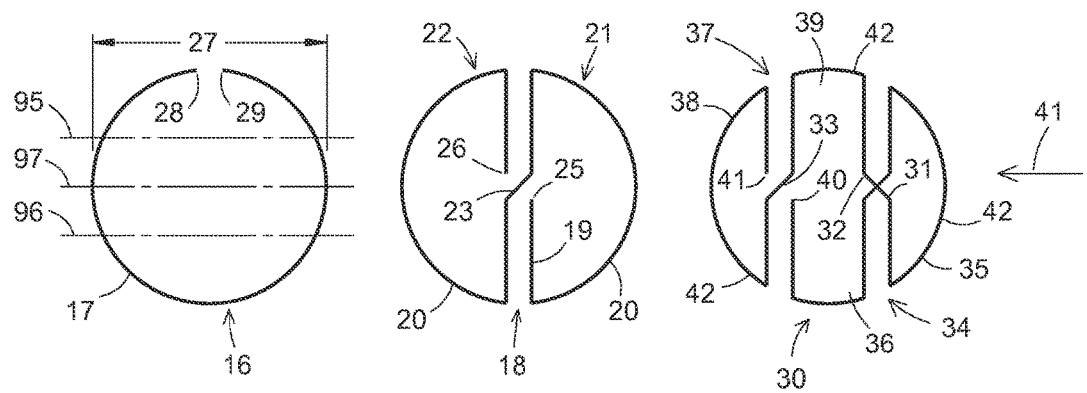
FIG. 3 graphically illustrates some examples of embodiments of a portion of a combination of sensor elements that may be an example of alternate embodiments for the sensor elements of FIG. 2 in accordance with the present invention.

FIG. 3 graphically illustrates some examples of embodiments of a portion of a combination of sensor elements that may be an example of alternate embodiments for sensor elements 121 of FIG. 2. FIG. 3 illustrates a plan view of one possible geometric shape that may be used to form an embodiment of an excitation element 16, an example of a possible geometric shape that may be used to form an embodiment of a first receiver sensor 18, and an example of a possible geometric shape that may be used to form an embodiment of a second receiver sensor 30. Element 16 and sensors 18 and 30 may be alternate embodiments of respective element 122 and sensors 123 and 124 of FIG. 2. Element 16 and sensor 18 are configured to be positioned adjacent each other and to form a mutual magnetic coupling or mutual inductance between element 16 and sensor 18. Sensor 30 is configured to have a mutual magnetic coupling or mutual inductance to element 16 that is different from the coupling between element 16 and sensor 18. As will be seen further hereinafter, the shapes of element 16 and sensors 18 and 30 are chosen such that the mutual inductance between element 16 and sensor 18 and the mutual inductance between element 16 and sensor varies as the target object in placed in different positions relative to sensors 18 and 30. In some embodiments, the relative positions of element 16 and sensors 18 and 30 is also chosen so that the mutual inductance varies responsively to positions of the target object.

In one embodiment, element 16 is formed in a geometric shape of substantially a circle. Element 16 has a periphery 17 that has the geometric shape. The geometric shape of element 16 also has an area. In an embodiment, element 16 may be formed from a conductor such as a wire or as a conductive trace on a PC board. The conductor may be formed into a loop that has the geometric shape and that may be used as an inductor. Two opposite ends of the conductor form connection terminals 28 and 29 that can be used to form an electrical connection to element 16.

Receiver sensor 18 is formed to have more loops that element 16. Receiver sensor 18 is also formed to have a periphery 20 that has a geometric shape. In an embodiment, periphery 20 of sensor 18 has substantially the same shape as the periphery of element 16. An embodiment may include that the geometric shape of sensor 18 may have substantially the same area as element 16. However sensor 18 is formed to have more loops than element 16. An embodiment may include that sensor 18 has two loops. In an embodiment, the two loops may be positioned adjacent each other. An embodiment may include that the two loops are positioned laterally adjacent to each other and in the same plane. A first loop 22 may extend from a connection terminal 26 around a left portion of periphery 20 to substantially a mid-point of periphery and then extends toward terminal 26 until reaching a cross-over portion 23 of the first loop 22. In an embodiment, the mid-point of periphery 20 may be substantially laterally across from terminal 26. An embodiment may include that loop 22 has an area that is substantially one-half of the area of sensor 18. A second loop 21 may extend from a connection terminal 25 away from portion 23 and around a right portion of periphery 20 to substantially a mid-point of periphery 20 and then extend to cross-over portion 23. An embodiment may include that loop 21 has an area that is substantially one-half of the area of sensor 18. Cross-over portion 23 forms an electrical and physical connection between loops 21 and 22. An embodiment may include that loops 21 and 22 each have a shape of substantially a mushroom cap with the two mushroom caps positioned in a back-to-back configuration.

In one embodiment, sensor 18 may have a geometric shape that is a twisted and rotated image of element 16. For example, sensor 18 can be envisioned by twisting element 16 about an axis 97 (illustrated in a general manner by a dashed line) and pushing periphery 20 into the desired geometric shape. An embodiment may include forming sensor 18 in a shape such that when placed adjacent to but not electrically shorted to element 16, a mutual inductance formed between element 16 and sensor 18 is a null value. In one embodiment the mutual inductance may be substantially zero. Those skilled in the art will appreciate that because of manufacturing tolerances and other variations, the null value may not be identically zero buy may be near zero, or alternately substantially zero. An embodiment may include forming 22 as conductor loop wound in a first direction, such as for example a counter-clockwise direction, and forming loop 21 as a conductor loop wound in a second direction, such as for example a clockwise direction.

Assume for example that sensor 18 is positioned adjacent to element 16, and an a.c. signal is applied to element 16. The mutual inductance between element 16 and sensor 18 may be substantially a null mutual inductance in response to no target object near to sensor 18 or near to any of loops 21-22. In one embodiment, the mutual inductance may be substantially zero. The signal applied to element 16 forms a magnetic field. Because of the symmetrical shape of loops 21 and 22, loop 22 may be considered as a loop that forms a signal of a first polarity and loop 21 may be considered as a loop that forms a signal of a second and substantially opposite polarity. This can also be regarded as substantially symmetry of the loops. Because of the substantially symmetry of loops 21 and 22, any signals induced into loops 21 and 22 will form substantially equal signals of opposite polarity in loops 21 and 22. These opposite signals will cancel out and the signal between terminals and 26 will substantially zero. If a target object is moved under or near sensor 18, the magnetic field from element 16 forms a current in the target object which then forms a magnetic field from the target object. If the target object is positioned under loop 22 the mutual inductance between element 16 and loop 22 may be increased and the signal between terminals 25 and 26 will responsively increase. In an embodiment, the mutual inductance may be a maximum value if the target object is placed solely under the center of loop 22. In an embodiment, the maximum value has a magnitude that is greater than the null value. In response, the signal between terminals 25-26 may also have a maximum amplitude. If the target object is positioned substantially under the center of sensor 18 the mutual inductance may be substantially the null value or alternately substantially zero. The signal between terminals 25 and 26 may also have a substantially zero amplitude. If the target object is positioned under loop 21, the magnitude of the mutual inductance may have a minimum value. Thus, the amplitude may be greater than the null value but the polarity may be reversed with respect to the polarity of the maximum value. Consequently, the polarity of the signal between terminals 25 and 26 may be reversed. For example, the direction of a current or a voltage formed between terminals 25 and 26 may be reversed. Those skilled in the art will appreciate that the signal between terminals 25 and 26 is an a.c. signal that may be referenced to any value of reference signal. For example the signal may be referenced to ground or to a negative supply voltage or a positive supply voltage. In another embodiment, the minimum value may have an amplitude or magnitude similar to the amplitude of the maximum mutual inductance but the polarity may be reversed with respect to the polarity of the maximum value. An embodiment may include that the mutual inductance may have a positive value as the maximum value, a non-positive value (relative to the positive value) as the minimum value, and the null value may be some threshold value that is between the maximum and minimum values. Thus the signal between terminals 25 and 26 may have a maximum value, a minimum value, and a null value that is a threshold value that is between the maximum and minimum values of the signal.

One advantage of sensor 18 is that noise signals induced into sensor 18 will be cancelled within sensor 18. Because of the symmetry of loops 21 and 22, the noise signals will form substantially equal signals of opposite polarity in loops 21 and 22. These opposite signals will cancel out and the signal between terminals 25 and 26 will be substantially devoid of the noise signals. The noise signal may be from a cellular telephone or signals produced during the operation of an automobile engine, or other source.

Receiver sensor 30 may be formed from a conductor that is also formed into a plurality of loops. In an embodiment, sensor 30 may also have two loops. Sensor 30 is also formed to have a periphery 42 that has a geometric shape. In an embodiment, periphery 42 of sensor 30 has substantially the same geometric shape as element 16. The portions of the conductor that are included in each loop may be electrically connected together by cross-over portions of the conductor. An embodiment may include that the two loops may be positioned laterally adjacent to each other. A first loop 37 may have a shape of substantially a mushroom cap attached to one-half of a rectangle. Loop 37 may have other shapes in other embodiments. A first portion 38 of loop 37 may extend from a connection terminal 41 around a left portion of periphery 42 to a first point along periphery 42 and then extend inward toward a first cross-over portion 33 of first loop 37 to a second portion 39 of loop 37. In one embodiment, the first point along the periphery may be approximately one-fourth of the distance around periphery 42. An embodiment may include that loop 37 has an area of approximately one-half the area of sensor 30. A second loop 34 of sensor 30 may also have a shape of substantially a mushroom cap attached to a second half of the rectangle. Loop 34 may have other shapes in other embodiments. A first portion 36 of loop 34 may extend from a connection terminal 40 outward away from cross-over portion 33 toward periphery 42, around one-fourth of periphery 42 and then extend inward away from periphery 42 to a cross-over portion 31 of loop 34. This first portion 36 may form a shape of one-half of a rectangle. A second portion 35 of loop 34 may have the substantially mushroom cap shape and may extend from cross-over portion 31 outward at an angle toward periphery 42, around approximately one-fourth of periphery 42 and then inward to a third cross-over portion 32 to connect to loop 37. In an embodiment, a midpoint of portion 35 of loop 34 may be directly opposite a midpoint of portion 38 of loop 37 such that a line through the two midpoints would bisect the center of sensor 30. An embodiment may include that loop 34 has an area of approximately one-half the area of sensor 30. In an embodiment, loops 34 and 37 may have substantial the same planar area. However, in some embodiments, the area of portions 35 and 38 may be different from the area of portions 36 and 39. Cross-over portion 32 forms a connection between loops 34 and 37. Cross-over portions 31 and 33 form connections between respective portions 35 and 36 and portions 38 and 39 of respective loops 34 and 37. An embodiment may include forming portions 36 and 38 as conductor loop portions wound in a first direction, such as for example a counter-clockwise direction, and forming portions 35 and 39 as conductor loop portions wound in a second direction, such as for example a clockwise direction. An embodiment may include forming loops 34 and 37 to each have clockwise and counter-clockwise portions that substantially cancel out the mutual inductance from the opposite direction portion of each loop.

In one embodiment, sensor 30 may have a geometric shape that is a multiple twisted and rotated image of element 16. For example, sensor 30 can be envisioned by twisting a top portion of element 16 about an axis 95 (illustrated in a general manner by a dashed line) and then twisting a bottom portion of element 16 about an axis 96 (illustrated in a general manner by a dashed line), and then pushing periphery 42 into the desired geometric shape. An embodiment may include forming sensor 30 in a geometric shape such that when placed adjacent to but not electrically shorted to element 16, a mutual inductance formed between element 16 and sensor 20 is a minimum value. In one embodiment the mutual inductance may be substantially zero.

Assume for example that sensor 30 is positioned adjacent to element 16, and an a.c. signal is applied to element 16. The mutual inductance between element 16 and sensor 30 may be substantially a null mutual inductance in response to no target object near to sensor 30 or any of loops 34-36. In one embodiment, the mutual inductance may be substantially zero. Sensor 30 is also formed to have symmetry of the loops. Portions 35 and 38 may be considered as loop portions that form signal of a first polarity and portions 36 and 39 may be considered as a loop portions that form a signal of a second and substantially opposite polarity. Thus each of loops 34 and 37 have symmetrical loops or loop portions. As a result of the symmetry of the loops, in the absence of a target object signals induced into portions 35 and 36 will have substantial equal amplitudes but opposite polarity and will cancel each other out, and signals induced into portions 38 and 39 will have substantial equal amplitudes but opposite polarity and will cancel each other out. Thus, as a result of the loop symmetry, in the absence of a target signals induced into sensor 30 will be substantially cancelled within sensor 30. Consequently, in the absence of a target object the signal formed between terminals 40-41 will be substantially zero. If the target object is positioned substantially under the center of portion 38 36, the mutual inductance is increased. In an embodiment, the mutual inductance may be a maximum value if the target object is placed solely under the center of portion 38. Also, if the target object is positioned substantially under the center of portion 35, the mutual inductance is also increased in respect to the null mutual inductance value. If the target object is placed substantially under the center of portions 36 and 39, the mutual inductance may be decreased in respect to the null value. In an embodiment, the mutual inductance may be minimum if the target object is placed substantially under the center of portions 36 and 39. As will be seen further hereinafter, the minimum value has a large absolute value but a polarity that is opposite to the maximum value. For example, the polarity may be negative in respect to the null value.

As a result of the symmetry of the loops, noise signals induced into sensor 30 will be substantially cancelled within sensor 30. Because of the symmetry of loops 34 and 37, the noise signals will form a substantially equal signal of opposite polarity in the loop portions. These opposite signals will cancel out and the signal between terminals 40 and 41 will substantially devoid of the noise signals.

Figure 4:
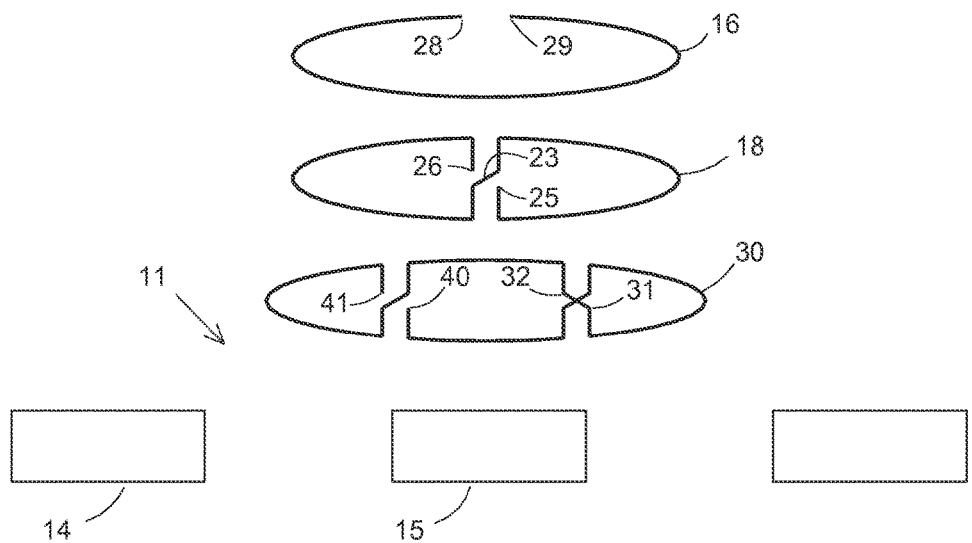
FIG. 4 graphically illustrates a portion of an example of an embodiment of some configurations of the sensor elements FIG. 1 in accordance with the present invention.

FIG. 4 graphically illustrates a portion of an example of an embodiment of some configurations of sensor elements 121 of FIG. 1. In one example embodiment, element 16 and sensors 18 and 30 may be formed in an overlying configuration relative to each other. Sensor 30 may be positioned to be facing the target object, illustrated as the example of wheel 11 (FIG. 1). Sensor 18 may be positioned overlying sensor 30. Element 16 may be positioned overlying sensor 18. The combination of element 16 and sensors 18 and 30 may be positioned such that the movement of teeth 14-15 is in a direction that traverses laterally across substantially the center of loops 22 and 21, and substantially across substantially the center of loops 34 and 37. In an embodiment the target object may traverse under loops 22 and 21 and loops 34 and 37 in the direction of an arrow 44.

Figure 5:
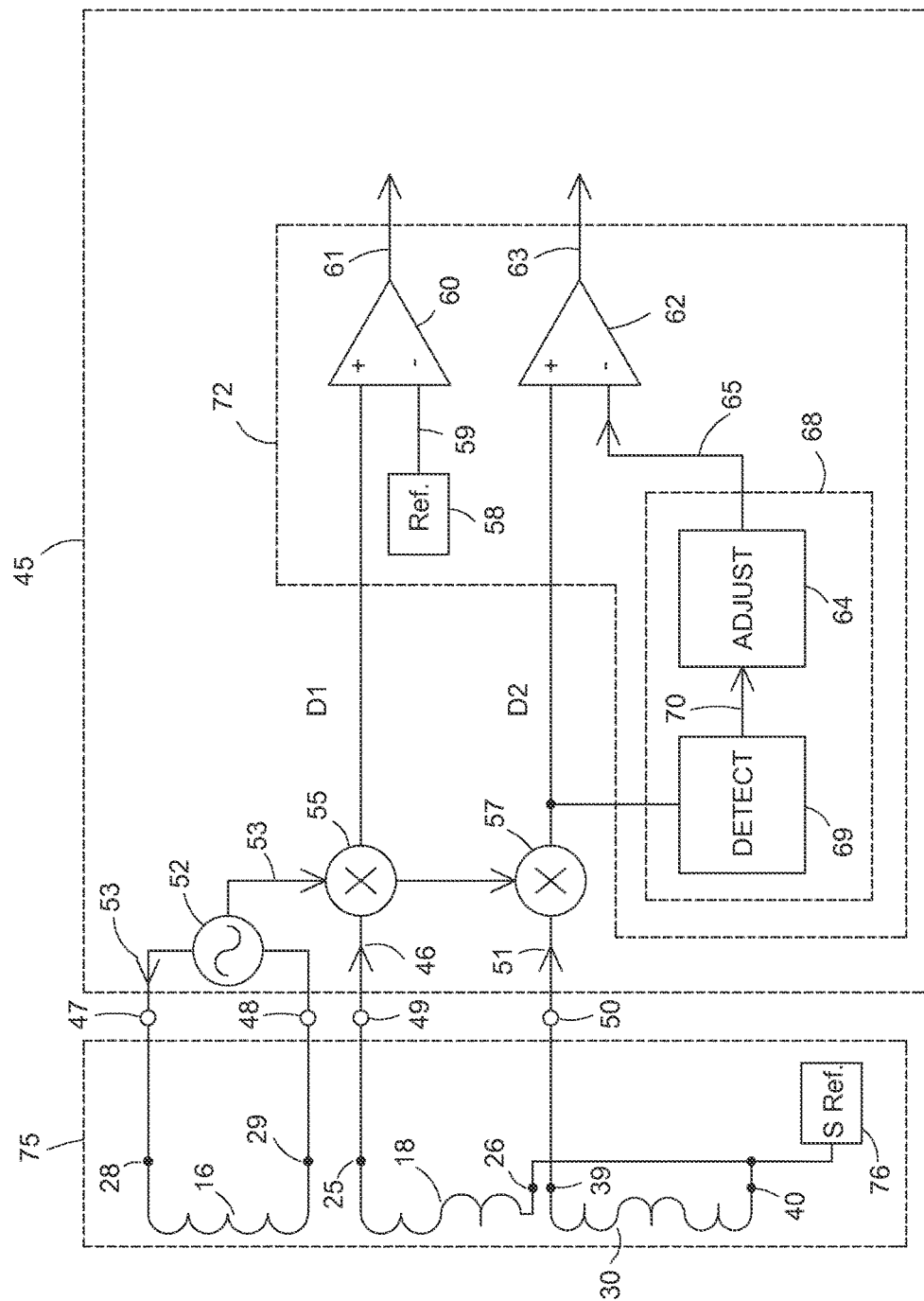
FIG. 5 schematically illustrates an example of an embodiment of a portion of a sensor circuit that may be an alternate embodiment of the sensor circuit of FIG. 2 in accordance with the present invention.

FIG. 5 schematically illustrates an example of an embodiment of a portion of a sensor circuit 45 that may be an alternate embodiment of circuit 127 that was explained the description of FIG. 2. Circuit 45 includes a signal generator 52 that is configured to form an excitation signal 53. Generator 52 may be an alternate embodiment of generator 129 that was explained in the description of FIG. 2. In one embodiment, circuit 45 is configured to operate with sensor elements 75 that are similar to sensor elements 121 that were explained in the description of FIG. 2. Sensor elements 75 may include a sensor reference circuit of sensor reference or SRef 76 that is similar to and that operates similarly to Sref 127 (FIG. 2). Element 16 and sensors 18 and 30 are illustrated as inductors for simplicity of the illustration but such illustration is not limiting to element 16 and sensors 18 and 30. The inductor representations are also illustrates to have windings in opposite directions to illustrate the elements of sensors 18 and 30 that were described in the descriptions of FIGS. 3 and 4. In an embodiment, circuit may include terminals 47 and 48 that are configured for connecting to respective terminals 28 and 29 of element 16. A terminal 49 of circuit 45 may be configured for receiving a signal from terminal 25 of sensor 18 and a terminal 50 of circuit 45 may be configured for receiving a signal from terminal 41 of sensor 30. Terminals 26 and of respective sensors 18 and 30 may be connected to a common reference voltage such as a ground reference or other common reference used for operating circuit 45. In other embodiments, terminals 26 and 40 may be connected to other elements of circuit 45. For example, in an embodiment circuit 45 may receive the differential a.c. signals from terminals 25 and 26 of sensor 18 and from terminals 40 and 41 of sensor 30 and process the differential signals instead of referencing the signals from sensors 18 and 30 to a ground reference.

Circuit 45 also includes a recognition circuit 72 that is an alternate embodiment of circuit 143 that was described in the description of FIG. 2 and operates similarly to circuit 143. A demodulator circuit or demodulator 55 and a demodulator circuit or demodulator 57 of circuit 45 are alternate embodiments of respective circuits 133 and 138 that were explained in the description of FIG. 2 and operate similarly to circuits 133 and 138.

An embodiment of circuit 72 may include a comparator 60 and a comparator 62. A reference signal generator or reference or ref 58 may be utilized to form a reference signal 59 for comparator 60. In an embodiment, circuit 72 may include a reference circuit 68 that is configured to form a reference signal 65 for comparator 62. In an embodiment reference circuit 68 may be an adaptable reference circuit 68 that is configured to form an adaptable reference signal 65 for comparator 62.

An embodiment of the operation of circuit 45 may include that generator 52 is configured to couple excitation signal 53 to excitation element 16. In an embodiment, signal 53 may be an a.c. signal. An embodiment may include that the frequency of the a.c. signal is greater than a frequency at which a target object moves under sensors 18 and/or 30. In an embodiment, the frequency of the a.c. signal may be between approximately one and approximately ten megahertz (1-10 MHz). An embodiment may include that demodulator 55 is configured to receive excitation signal 53 and to receive a receiver signal 46 from sensor 18. Demodulator 55 is configured to demodulate signal 46 and form a detection signal D1 that is representative of the mutual inductance of sensor 18. In an embodiment, this mutual inductance may be the mutual inductance between sensor 18 and element 16. In an embodiment, demodulator 57 may be configured to receive signal 53 and to receive a receiver signal 51 from sensor 30. Demodulator 57 may be configured to demodulate signal 51 and form a detection signal D2 that is representative of the mutual inductance of sensor 30. In an embodiment, this mutual inductance may be the mutual inductance between sensor 30 and element 16. In an embodiment, demodulators 55 and 57 may be formed to demodulate the respective received signals 46 and 51 from respective sensors 18 and 30, and to form a.c. signals that swing around a common reference signal. For example, an embodiment may include that signals D1 and D2 are a.c. signals that swing above and below the value of reference signal 59. In an embodiment, the value of the signal from Sref 76 and signal 59 may have substantially the same value. In other embodiments, demodulators 55 and 57 may receive differential signals from respective sensors 18 and 30 and form signals D1 and D2 as a.c. signals that have peak and valley values around a common mode voltage. The common mode voltage may be ground or may be signal 59 or may be some other voltage value. An embodiment of demodulators 55 and 57 may include forming the demodulators to demodulate the respective received signals 46 and 51 from respective sensors 18 and 30, and to optionally rectify the demodulated signals to form a slowly varying signal that is representative of the mutual inductance of respective sensors 18 and 30. For example, the value of the signal may vary as the target object moves. In an embodiment, demodulators 55 and 57 may form the signal as a varying d.c. signal that is representative of the mutual inductance of respective sensors 18 and 30.

Figure 6:
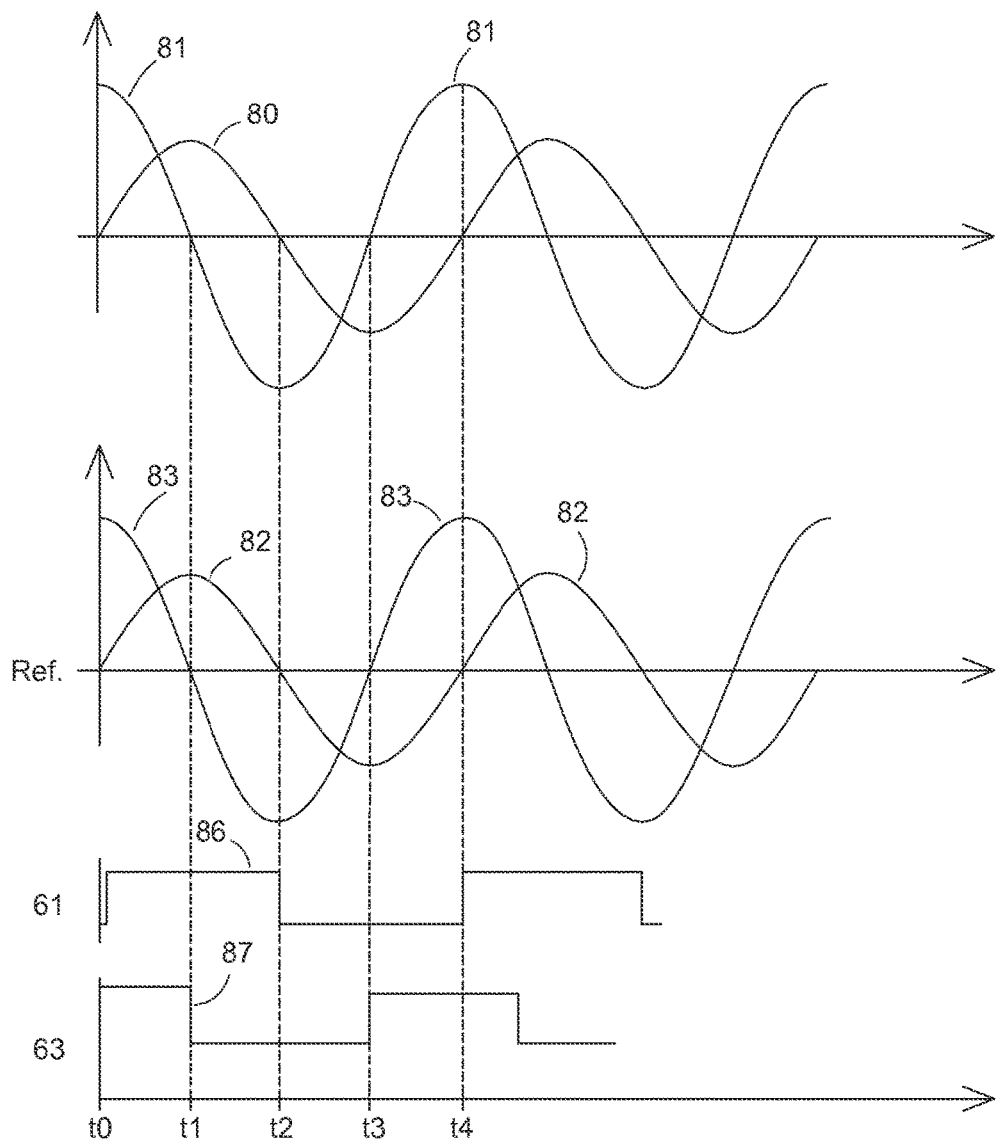
FIG. 6 is a graph having plots that illustrate some of the signals formed by the circuit of FIG. 1 and/or FIG. in accordance with the present invention.

FIG. 6 is a graph having plots that illustrate some of the signals formed by circuit 45. The abscissa indicates increasing time and the ordinate indicates the amplitude and polarity of the corresponding signals. A plot 80 illustrates an example embodiment of the mutual inductance of sensor 18 and a plot 81 illustrates an example embodiment of the mutual inductance of sensor 30. A plot 82 illustrates an example embodiment of detection signal D1 and a plot 83 illustrates an example embodiment of detection signal D2. The embodiment of signal D1 illustrated in FIG. 6 is formed to be an a.c. signal that has peak and valley values that are referenced to and that are respectively greater than and less than the value of reference signal 59. Similarly, the embodiment of signal D2 illustrated in FIG. 6 is formed to be an a.c. signal that has peak and valley values that are referenced to and that are respectively greater than and less than the value of reference signal 65. A plot 86 illustrates signal 61 and a plot 87 illustrates signal 63. This description has references to FIGS. 3-6.

Assume for example that in one application, the target object is a toothed wheel similar to wheel 11 that is illustrated in FIG. 1 and that circuit 45 and elements 75 are configured to detect movement of wheel 11. Also, assume that a width (W) of each tooth of wheel 11 (FIG. 1) is less than a diameter 27 (FIG. 3) of element 16 and sensors 18 and 30.

Assume that at a time t0, a gap between two teeth, such as between teeth 14 and 15, is positioned under substantially the center of sensor 18, such as for example under cross-over portion 23, and positioned under portions 36 and 39 of sensor 30. Thus, a tooth is to the left and to the right of sensors 18 and 30. Because none of the target object is under loops 21 or 22 of sensor 18, the mutual inductance of sensor 18 is substantially a null value as illustrated by plot 80 at t0. In some embodiments, the null value may be near a zero mutual inductance value and in an embodiment the null value may be substantially zero. In some embodiments, the null value may be a value that is substantially an average value of the mutual inductance. Thus signal D1 also has a null value as illustrated by plot 82 at t0. In one embodiment, signal D1 correspondingly may have a value that is substantially signal 59. Consequently, signal D1 is no greater than reference signal 59 which causes the output of comparator 60 to be negated as illustrated by plot 86. The exact value of signal D1 which causes the negating or asserting of signal 61 is determined by the value of signal 59. In one embodiment, signal 59 may have a value that is between the anticipated peak and valley values of signal D1. For example, signal 59 may be a percentage of the difference between the peak and minimum or valley value of signal D1. In other embodiments, the value of signal 59 may be near a midpoint of the power supply used for operating comparator 60. In other embodiments, the value of signal 59 may be a ground value for the case of differential signals D1 and D2 that may swing above and below ground, or may be other values in other embodiments. In regard to sensor 30, because an edge of a tooth is near each of portions 38 and 35 of sensor 30 but not under portions 36 and 39, the mutual inductance of sensor 30 is a maximum value as illustrated by plot 81 at t0. Consequently, signal D2 also has a maximum value as illustrated by plot 83 at t0. Since signal D2 is greater than reference signal 65, direction signal 63 is asserted.

As wheel 11 rotates across the sensors such as between times t0 and t1, assume that a tooth begins moving under loop 22 of sensor 18 which begins increasing the mutual inductance of sensor 18 as illustrated by plot 80. As a result, signal D1 begins to increase as illustrated by plot 82. As signal D1 increases above reference signal 59, comparator 60 asserts movement detected signal 61. The wheel movement also causes the tooth to move under portion 38 of sensor 30 which begins decreasing the mutual inductance of sensor 30 as illustrated by plot 81 between t0 and t1. As the center of the tooth is positioned under the center of loop 22 of sensor 18, the mutual inductance of sensor 18 is increased as illustrated by plot 80 at t1. In some embodiments, the mutual inductance may be a maximum or peak value. The center of the tooth is also moving from the center of portion 38 toward portions 36 and 39 of sensor 30 which continues decreasing the value of the mutual inductance as illustrated by plot 81 between t0 and t1. In response, signal D2 also decreases in value as illustrated by plot 83. In response to signal D2 being less than reference signal 65, such as for example near or around t1, comparator 62 may negate signal 63.

Between times t1 and t2, assume that the tooth moves from under the center of loop 22 of sensor 18 to under the actual center of sensor 18, also the tooth also moves from portion 38 of sensor 30 to under the center of portions 36 and 39. Positioning the tooth under the center of sensor 18 forms a null mutual inductance as illustrated by plot 80 at t2. In some embodiments the null value may be near to a zero value of mutual inductance or in some embodiments may be approximately a zero mutual inductance. As a result, the value of signal D1 also has a value that is near to the common mode value of signal D1, such as for example near to the value of signal 59, as illustrated by plot 82 at t2. In other embodiments, the value of D1 may be substantially zero. In response to the value of D1 becoming less than the value of signal 59 signal 61 is negated. The tooth having a position under portions 36 and 39 of sensor 30 forms a minimum mutual inductance for sensor 30 as illustrated by plot 81 at t2. Consequently, the value of signal D2 decreases as illustrated by plot 83 at t2. Circuit 72 maintains signal 63 negated since the value of signal D2 is less than signal 65.

Assume that between t2 and a time t3, the tooth is moving from the center of sensor 18 to under loop 21 of sensor 18 and from under portions 36 and 39 of sensor 30 to under portion 35 of sensor 30. As the tooth moves from the center of sensor 18 to the center of loop 21 of sensor 18, the mutual inductance of sensor 18 decreases and changes polarity, as illustrated by plot 80 just after t2 and between t2 and t3, until reaching a minimum value near t3. Consequently, the value of signal D1 decreases below signal 59. Signal 61 is negated in response to the value of D2. The tooth moving from under portions 36 and 39 of sensor 30 to under portion 35, increases the mutual inductance of sensor 30 from the minimum mutual inductance toward a null mutual inductance as illustrated by plot 81 from t2 to t3. Signal D2 responsively increases from a minimum value or valley value at t2 to a value at t3 that is near to signal 65 as illustrated by plot 83. In some embodiments, signal D2 may have a substantially zero value at t3. Signal 63 may remain negated as signal D2 increases and may be asserted in response to D2 having a value no less than signal 65 as illustrated by plot 87 between t2 and t3

Assume that between t3 and a time t4 the wheel continues to rotate and the tooth moves from the center of loop 21 of sensor 18 toward the periphery of sensor 18 and to outside the periphery near time t4. As the center of the tooth moves from loop 21 to outside of loop 21, the mutual inductance of sensor 18 increases from the minimum toward a null value as illustrated by plot 80 between t3 and t4, and becomes substantially a null value when no tooth is under sensor 18 as illustrated at t4. In one embodiment, the mutual inductance becomes substantially zero. Detection signal D1 increases toward the value of signal 59 and becomes no less than signal 59 which results in asserting signal 61 near or just after time t4. For sensor 30, the tooth moving under portion 35 and toward the outside of loop 34 increases the mutual inductance as illustrated by plot 81. Consequently, detection signal D2 increases as illustrated by plot 83. Signal 63 remains asserted as the value of signal D2 increases above signal 65.

In some embodiments, reference circuit 68 may be an adaptable reference circuit 68 that forms an adaptable value for reference signal 65. In some embodiments, the peak excursions of the mutual inductance of sensor 30 may not be equal and the resulting maximum and minimum values of signal 51 may not all be equal in magnitude. Adaptable reference circuit 68 is configured to form adaptable reference signal 65 to have a value that is somewhere between the maximum and minimum values of signal D2. In an embodiment, circuit 68 may form signal 65 to have a value that is a percentage of the maximum peak values of signal D2. An embodiment may include that signal 65 is formed to have a value that is an average value of signal D2. Circuit 68 may include a detect circuit 69 and an adjust circuit 64. Detect circuit 69 may be configured to sample signal D2 and form an average of the peak values of signal D2. In an embodiment detect circuit 69 may be a sample-and-hold circuit that samples the peak values of signal D2 and forms an average value of the peak values. In other embodiments, circuit 69 may be other circuits that can form an average of signal D2, such as for example an analog-to-digital converter and digital logic or optionally a digital memory circuit. Adjust circuit 64 may be configured to adjust the averaged peak values by some percent to form signal 65. An embodiment may include that the percentage is approximately one-half but may be other values in other embodiments.

Figure 7:
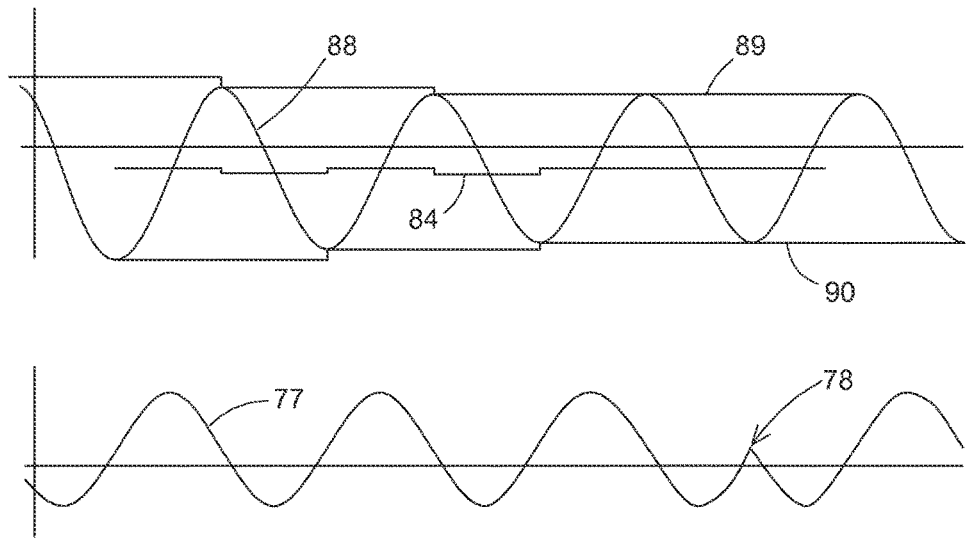
FIG. 7 is a graph that illustrates an example embodiment of variations of some of the signals formed by the circuit of FIG. 1 and/or FIG. 5 in accordance with the present invention.

FIG. 7 is a graph that illustrates an example embodiment of variations of signal 65. A plot 88 illustrates the mutual inductance of sensor 30 and variations that may occur in the mutual inductance. A plot 89 illustrates variations in the maximum value of the mutual inductance and a plot 90 illustrates variations in the minimum value of the mutual inductance. The non-symmetrical shape of the mutual inductance of sensor 30 will also be translated to unequal peak values of signal D2. A plot 84 illustrates one example of changes to the value of signal 65 in response to the variations of the mutual inductance of sensor 30, or alternately to the variations in the maximum and minimum values of signal D2. As illustrated by plot 84, circuit 64 is configured to decrease the value of signal 65 in response to a decrease in signal D2 and to increase signal 65 in response to an increase in the value of signal D2.

Alternately, for an embodiment of circuit 45 receiving differential signals from sensors 18 and 30 and for signals D1 and D2 having differential values around a common mode voltage. Each time a crossing of the common mode voltage, such as substantially a zero crossing for example, is detected by comparator 60, comparator 62 determines the polarity of the signal from sensor 30. This polarity can be used to show the direction of the tooth wheel rotation.

A plot 77 illustrates the mutual inductance of sensor for another example embodiment. Assume that wheel 11 is rotating and that at a point 78, wheel 11 begins to rotate in an opposite direction. The change in direction causes a change in the mutual inductance sensed by sensor 30, and a corresponding change in the peak value of signal D2. The change in the peak value of D2 also causes a change in the value of signal 65. Since the peak value of signal D2 has decreased, the value of reference signal 65 is also decreased. The decrease in signal 65 may be used to indicate that the direction of wheel 11 has changed.

If the position of the center of the tooth must be detected with more accuracy than the edge of the tooth, the connections from sensors 18 and 30 to circuit 45 can be swapped.

Figure 8:
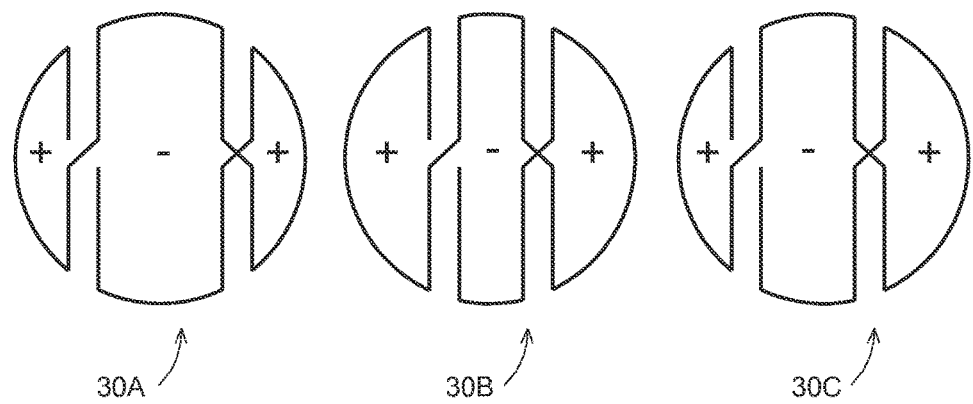
FIG. 8 illustrates portions of other example embodiments of the sensor elements in accordance with the present invention.

FIG. 8 illustrates portions of other example embodiments of sensor 30. In other embodiment, the teeth width and gap width may be positioned differently, thus, the mutual inductance between element 16 and sensor 30 may not be null when the tooth edge is in the middle of sensor 30, but the position that provides the null value may be shifted to the left or to the right. For example, the substantial minimum mutual inductance may occur for the tooth edge shifted to the right or to the left of sensor 30. To compensate for this effect, the layout of sensor can be modified. For example, portions 36 and 39 can be made narrower while portion 35 and/or portion 38 can be larger or vice versa as illustrated by alternated embodiments 30A-30C of sensor 30. Portions 36 and 39 may be such that the mutual inductance stays substantially minimized or substantially null without metal in proximity.

In one embodiment, sensors 18 and 30 may be formed by printing conductive traces on a PC board. For example one of sensors 18 or 30 may be formed by printing traces in first direction, such as for example a clockwise direction, on the PC board. Then the other one of sensors 18 or 30 may be printed in the opposite direction, such as for example a counter-clockwise direction, on an overlying or underlying layer of the PC board. The two sensors may then be overlaid and appropriately connected to terminals, etc.

Figure 9:
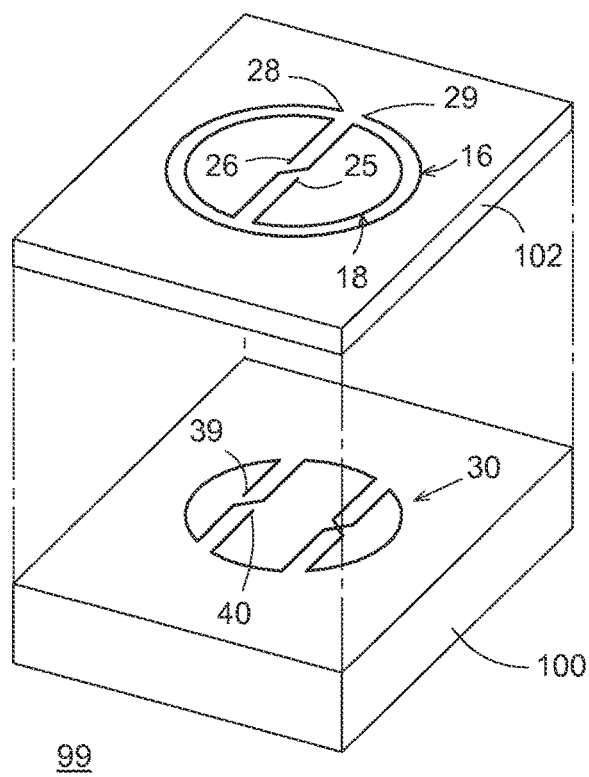
FIG. 9 illustrates an exploded view of an example of an embodiment of a printed circuit (PC) board on which portions of the sensor elements may be formed in accordance with the present invention.

FIG. 9 illustrates an exploded view of an example of an embodiment of a printed circuit (PC) board 99 on which element 16 and sensors 18 and 30 may be formed. Element 16 and sensors 18 and 30 may be formed in various geometric shapes and relative positions in addition to those illustrated in FIG. 3 and FIG. 4. In one embodiment, board 99 may be formed as a multilayer PC board that includes a main substrate 100 on which sensor may be formed such as for example as a conductive trace formed on substrate 100. An insulating layer 102 may be formed overlying sensor 30. For example, layer 102 may be an epoxy resin that is formed on board 100 and covering sensor 30. In an embodiment, sensor 18 may be formed within and in the same plane with element 16. Element 16 and sensor 18 also may be formed as conductor traces on layer 102.

Element 16 and sensors 18 and 30 may have other geometric shapes. For example, the geometric shape may be a square or a rectangle or an ellipse or other shape other than the circular shape described hereinbefore.

Figure 10:
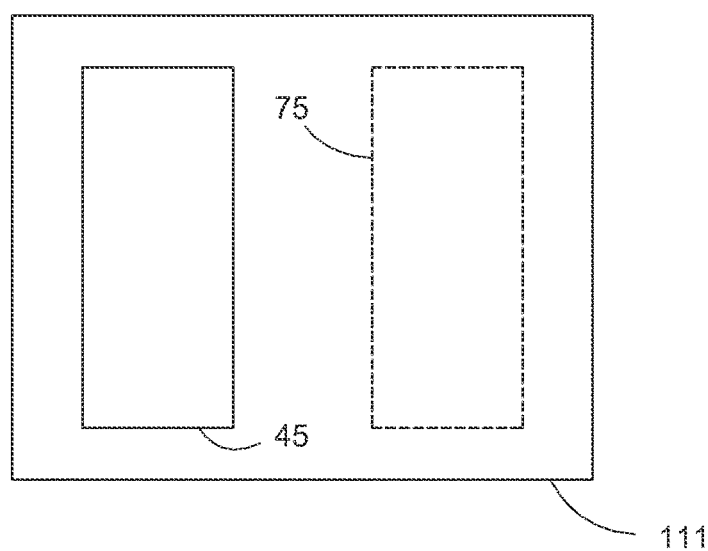
FIG. 10 illustrates an enlarged plan view of a semiconductor device that includes portions of the system of FIG. 1, FIG. 2, and/or FIG. 5 in accordance with the present invention.

FIG. 10 illustrates an enlarged plan view of a portion of an embodiment of a semiconductor device or integrated circuit 110 that is formed on a semiconductor die 111. Circuit 120 and/or circuit 45 is formed on die 111. Die 111 may also include other circuits that are not shown in FIG. 9 for simplicity of the drawing. Circuit 45 and device or integrated circuit 110 are formed on die 111 by semiconductor manufacturing techniques that are well known to those skilled in the art. In one embodiment, sensor element 75 and/or 122 or portions thereof may be formed on die 111 as illustrated by dashed lines.

Referring back to FIG. 1, those skilled in the art will appreciate that although the target is illustrated and explained as a curved or circular wheel 11, the target may be a linear object that has protrusions that are similar to teeth 14 and 15.

Figure 11:
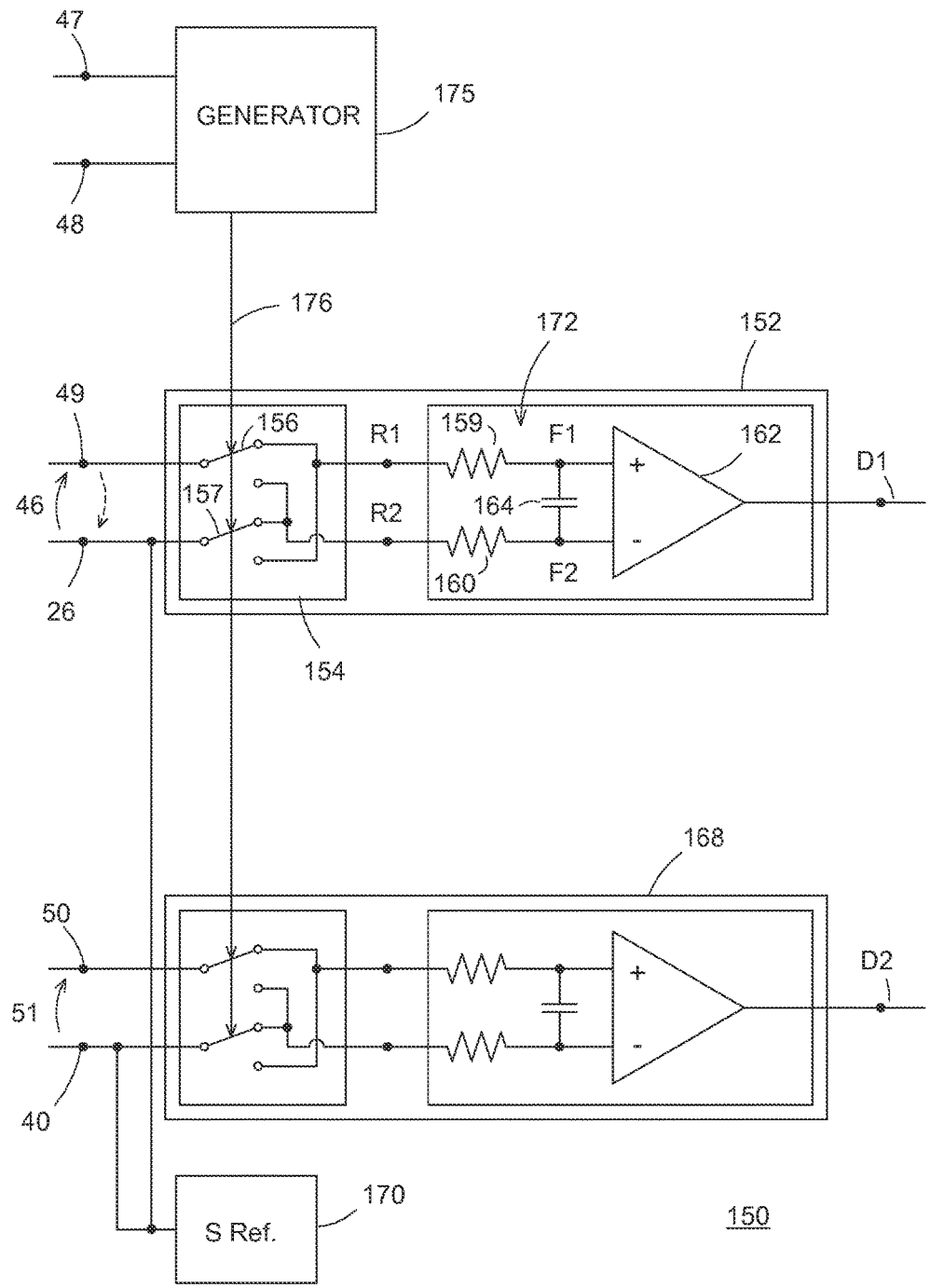
FIG. 11 schematically illustrates an example of an embodiment of a portion of a sensor circuit that may be an alternate embodiment of portions of a sensor circuit of FIG. 2 or FIG. 5 in accordance with the present invention.

FIG. 11 schematically illustrates an example of an embodiment of a portion of a circuit 150 that may be an alternate embodiment of portions of circuit 45 that was explained in the description of FIG. 5. Circuit 150 includes a signal generator or generator 175 that is an alternate embodiment of signal generator 52. Generator 175 is configured to form an excitation signal 176 that is an alternate embodiment of signal 53 (FIG. 5). The frequency of signal 176 is much greater than the frequency variation of the mutual inductance of sensor 18. Circuit 150 also includes a demodulator circuit 152 that may be an alternate embodiment of demodulator 55 that was explained in the description of FIG. 5 and a demodulator circuit 168 that may be an alternate embodiment of demodulator 57 that was explained in the description of FIG. 5. Circuit 150 may also include a sensor reference circuit or SRef 170 that is an alternate embodiment of SRef 76 (FIG. 5).

Demodulator 152 includes a low pass filer 172, an amplifier 162, and a switch circuit or switch 154. In one embodiment, SRef 170 forms a reference signal having a value that is between the value of the voltages supplied to operate amplifier 162. For example, if amplifier 162 operates between five volts (5 V) and ground, SRef 170 may form a signal of approximately two and one-half volts (2½ V). If amplifier 162 operates between a positive supply and a negative supply, SRef 170 may set supply a signal that is substantially ground or alternately a signal that is halfway in between the positive and negative supplies. Consequently, the value of signals 46 and 51 received from respective sensors 18 and 30 are reference to the value of the signal from SRef 170.

Switch 154 is configured to receive signal 176 and signal 46 from sensor 18 and couple the signals to amplifier 162 through low pass filter 172. In one example embodiment, filter 172 may include a capacitor 164 and resistors 159 and 160. During the asserted portion of signal 176, sensor 18 generates signal 46 between terminals 49 and 26 such that terminal 49 is more positive than terminal 26 (as illustrated by a solid arrow). Also during the asserted portion of signal 176, signal 176 control switches 156 and 157 to couple the more positive terminal of sensor 18, such as for example terminal 49, to the positive input of amplifier 162 and to couple the less negative terminal of sensor 18, such as for example terminal 26, to the inverting input of amplifier 172. During the negated portion of signal 176, sensor 18 generates signal 46 such that terminal 26 is more positive than terminal 49 (as illustrated by a dashed arrow). Also during the negated portion of signal 176, signal 176 controls switches 156 and 157 to couple the more positive terminal of sensor 18, such as for example terminal 26, to the positive input of amplifier 162 and to couple the less positive terminal to the inverting input of amplifier 162. Thus, amplifier 162 forms an output signal that is representative of the mutual inductance between sensor 18 and element 16.

Those skilled in the art will appreciate that the low pass filter may be formed by other means including using a digital signal processor (DSP) to implement the low pass filter. Additionally, the DSP may also be used for amplifier 162 and switch 154.

Demodulator 168 is formed substantially similar to and operates substantially similar to demodulator 152 except that demodulator 168 is configured to receive the signals from sensor 30 instead of sensor 18.

One skilled in the art will appreciate that in an embodiment the sensors may include that a common coil may be formed, such as by example as forming traces on a PCB.

Another coil, such as for example the coil of sensor 18, may be formed to include of two loops. The first one, marked 22, may be counter-clock wise while the second one, marked 21, may be clock wise or vice versa. The variation of the mutual inductance between the common coil and the center coil can be used to detect the middle of the tooth or the middle of the gap between two teeth.

Another coil, such as for example a coil of sensor 30, may include three loops. A first and last loop, marked 36, may be counter-clock wise while the second one, marked 34, may be clock wise or vice versa. A variation of the mutual inductance between the first coil and the second coil can be used to detect the edge of the teeth.

One or more of the 3 coils can be made of multiple turns or loops to increase the sensitivity of the sensor. In other embodiments, the position of the first and second coil may be different relative to a common coil. For example, the first and second coils may be on the opposite side of the common coil.

An embodiment may include that one of the coils, for example the second coil, includes a plurality of loops including a first loop and a second loop, the first loop may be formed as a conductor having a first end and a second end, the second loop may be formed as a conductor having a third end and a fourth end wherein the second end is coupled to the fourth end; the first loop having a first portion formed in a shape of a substantially half rectangle and a second portion formed in a shape of substantially a mushroom cap; and the second loop having a first portion formed in a shape of a substantially half rectangle and a second portion formed in a shape of substantially a mushroom cap wherein the first portion of the first loop and the first portion of the second loop are positioned to form a shape that is substantially a rectangle having two long sides and two short sides with an opening in the two long sides. For example as illustrated in FIG. 3, the first conductor may be formed so that another portion of the conductor that is between the first portion and the second portion, is routed to run through the opening in one side of the rectangle. The second conductor could be similarly formed to route through the opening in an opposite side of the rectangle side.

There may be two mutual inductances between the common coil and the other two coils. Without any metal, such as the metal of a rotational element, in proximity to the coils the mutual inductances are null. The simple coil symmetry may assist in forming a null mutual inductance with the first coil. For the second coil the relative loop sizes can be adjusted to assist in forming the null mutual inductance.

In reference to the first coil, because of the coil layout the mutual inductance can be substantially maximum when a tooth aligns with the loop 22 and it may be substantially a minimum when the tooth aligns with the loop 21. When the center of the tooth aligns with the middle of the coil the mutual inductance is minimized and may be substantially null because of the coil and tooth symmetry.

In reference to the second coil, the mutual inductance may be substantially a maximum when teeth overlap with the first and last loops while the gap is aligned with the portions 36 and 39. The mutual inductance may be substantially a minimum with the tooth in or near the middle. When the edge of the tooth substantially aligns with the middle of the coil the mutual inductance is substantially minimized or a substantial null because of symmetry.

In operation and because of the mutual inductances, voltages will develop across the first and second coils in response to the position of the tooth (or teeth). These alternating voltages may be demodulated, such as for example by means of synchronous rectification with the oscillator. The demodulated (or in some embodiments rectified) signals can then be connected to comparators inputs '+'.

The comparators inputs '−' may be referenced to the common reference, such as for example to ground reference, if the zeroing of the mutual inductance has been realized. If it's not possible or there is a slow varying signal superposed (for example due to the eccentricity of the tooth wheel) an adaptive threshold may be implemented. The substantial maximum and the substantial minimum values of the signals (for example the demodulator signals) can be measured and stored in a peak & valley block. In one example embodiment, the peak & valley block can be an analog sample and hold or an ADC and digital memory. Based on these two values, for example the peak and valley values) a threshold may be calculated (for example average of peak and valley).

Each time a crossing, such as substantially a zero crossing for example, is detected by the first comparator the second comparator determines the polarity of the center coil signal. This polarity can be used to show the direction of the tooth wheel rotation.

If the position of the center of the tooth must be detected with more accuracy than the edge of the tooth, the edge and center coils connections to the sensor interface circuit can be swapped.

The symmetry of the first and second sensors along with the excitation element can improve the sensitivity of the sensor elements in respect to prior elements. The improved sensitivity can facilitate placing the sensor elements further away from the target object than prior elements. The improved sensitivity may also reduce the power dissipation over that of prior elements.

From all the foregoing, those skilled in the art will appreciate that in one embodiment, a position and rotational direction sensor may comprise:

a first coil configured for positioning a first distance from a rotational element; a second coil configured for positioning a second distance from the rotational element; a third coil configured for positioning a third distance from the rotational element wherein the second distance is greater than the first distance and the third distance is greater than the second distance; one of the first or third coils including a plurality of loops including a first loop and a second loop, the first loop formed as a conductor having a first end and a second end, the second loop formed as a conductor having a third end and a fourth end wherein the second end is coupled to the fourth end; the first loop having a first portion formed in a shape of a substantially half rectangle and a second portion formed in a shape of substantially a mushroom cap; and the second loop having a first portion formed in a shape of a substantially half rectangle and a second portion formed in a shape of substantially a mushroom cap wherein the first portion of the first loop and the first portion of the second loop are positioned to form a shape that is substantially a rectangle having two long sides and two short sides with an opening in the two long sides.

In another embodiment the position and rotational direction sensor may include that the second coil is formed from a conductor having two portions where a first portion forms a shape of substantially a mushroom cap and the second portion also forms a mushroom cap shape with a base portion of both of the mushroom shapes facing substantially together.

Another embodiment may include that the first coil may have at least three loops.

In another embodiment the first coil may be a common coil.

Another embodiment may include that a width of the first loop of the plurality of loops is greater than the second loop of the plurality of loops.

From all the foregoing, one skilled in the art will appreciate that an embodiment of a device for detecting rotation of an object may comprise:

a semiconductor device having a sensor circuit, such as for example circuit 45, that includes a signal generator, such as for example generator 52, configured to generate an excitation signal, such as for example signal 53;

a first terminal, such as for example terminal 47, of the sensor circuit configured to couple the excitation signal to an excitation element, such as for example element 16;

a first demodulator, such as for example demodulator 55, of the sensor circuit configured to receive the excitation signal and to receive a first receiver signal, such as for example at signal 46, from a first receiver sensor, such as for example sensor 18, wherein the first receiver signal is representative of a first mutual inductance that is formed between the excitation element and the first receiver sensor, the first demodulator configured to form a first detection signal, such as for example signal D1, that is representative of the first mutual inductance;

a second demodulator, such as for example demodulator 57, of the sensor circuit configured to receive the excitation signal and to receive a second receiver signal, such as for example signal 51, from a second receiver sensor, such as for example sensor 30, wherein the second receiver signal is representative of a second mutual inductance that is formed between the excitation element and the second receiver sensor, the second demodulator configured to form a second detection signal, such as for example signal D2, that is representative of the second mutual inductance;

the sensor circuit configured to assert a rotation detected signal, such as for example signal 61, responsively to a difference between the first detection signal and a first reference signal, such as for example signal 59; and the sensor circuit configured to assert a rotation direction signal, such as for example signal 63, responsively to a difference between the second detection signal and an adaptable reference signal, such as for example signal 65.

In another embodiment, the device may include a first comparator, such as for example comparator 60, configured to receive the first detection signal and the first reference signal and form the rotation detected signal on an output of the first comparator.

Another embodiment may include a second comparator, such as for example comparator 62, configured to receive the second detection signal and the adaptable reference signal and form the rotation direction signal on an output of the second comparator.

An embodiment may include that the excitation element has a first geometric shape and the first receiver sensor has a second geometric shape that is substantially a twisted image of the first geometric shape.

In an embodiment, the second receiver sensor may have a third geometric shape that is substantially a twisted image of the second geometric shape.

Another embodiment may include that the first demodulator may be configured to remove an a.c. component of the excitation signal from the first receiver signal.

An embodiment may include that the signal generator may be configured to form an a.c. signal having a frequency that is greater than a first frequency at which the first mutual inductance varies and greater that a second frequency at which the second mutual inductance varies and wherein the a. c. component removed by the first demodulator corresponds the a. c. signal.

In an embodiment, the second demodulator may be configured to remove an a.c. component of the excitation signal from the second receiver signal.

An embodiment may include that the adaptable reference circuit forms an average signal that is substantially an average value of the second detection signal and forms the adaptable reference signal substantially equal to the average signal.

Those skilled in the art will appreciate that an embodiment of a method of forming a sensor circuit may comprise:

forming the sensor circuit, such as for example circuit 45, to receive a first receiver signal, such as for example signal 46, from a first receiver sensor, such as for example sensor 18, and form a first detection signal, such as for example signal D1, wherein the first detection signal has a magnitude that increases in response to a metal object moving from distal to the first receiver sensor to proximal to a first portion, such as for example loop 22 or 21, of the first receiver sensor, wherein the magnitude of the first detection signal decreases in response to the metal object moving toward substantially a center, such as for example portion 23, of the first receiver sensor;

configuring the sensor circuit to assert a rotation detection signal, such as for example signal 61, responsively to a first value, such as for example the value of signal 59, of the first detection signal;

forming the sensor circuit to receive a second receiver signal, such as for example signal 51, from a second receiver sensor, such as for example sensor 30, and form a second detection signal, such as for example signal D2, wherein the second detection signal has a minimum value in response to the metal object in a position substantially centered to the second receiver sensor, and has a greater value in response to the metal object having a position distal from the center of the second receiver sensor; and configuring the sensor circuit to assert a rotation direction signal, such as for example signal 63, responsively to a first value, such as for example the value of signal 65, of the second detection signal.

An embodiment of the method may include configuring an adaptable reference circuit, such as for example circuit 68, to form an adaptable reference signal, such as for example signal 65, having a value that is a percentage of a difference between the greater value of the second detection signal and the minimum value of the second detection signal wherein the first value of the second detection signal is substantially equal to the value of the adaptable reference signal.

Another embodiment may include configuring an adaptable reference circuit, such as for example circuit 68, to form an adaptable reference signal, such as for example signal 65, having a value that is an average of a maximum value and the minimum value of the second detection signal wherein the first value of the second detection signal is substantially equal to the value of the adaptable reference signal.

In another embodiment, the method may include configuring the sensor circuit to form the first detection signal to include a minimum value in response to the metal object in a position substantially centered to the first receiver sensor and in response to the metal object being distal to the first receiver sensor.

Another embodiment may include configuring the sensor circuit to form the first detection signal to correspond to a mutual inductance formed between the first receiver sensor and an excitation element and to form the second detection signal to correspond to another mutual inductance formed between the second receiver sensor and the excitation element.

Those skilled in the art will also appreciate that a sensor circuit may comprise:

a first receiver circuit configured to receive a first signal that is representative of a first mutual inductance and form a first detection signal that is representative of the first mutual inductance, wherein the first variable mutual inductance varies in response to a position of a metal object;

a second receiver circuit configured to receive a second signal that is representative of a second mutual inductance and form a second detection signal that is representative of the second mutual inductance, wherein the second mutual inductance varies in response to the position of the metal object; and a recognition circuit, such as for example 72, configured to assert a movement detected signal, such as for example 61, responsively to a first value of the first detection signal, such as for example D1, configured to assert a movement direction signal, such as for example 63, responsively to a first value of the second detection signal, such as for example D2.

An embodiment may include that the first detection signal has a minimum value and a maximum value that are offset in phase with respect to a minimum value and a maximum value, respectively, of the second detection signal.

Another embodiment may include that the first mutual inductance is formed between an excitation element having a first inductor including at least one inductor loop and a first receiver sensor having a second inductor including a second loop that has more than at least one inductor loop; and the second mutual inductance formed between the excitation element and a second receiver sensor having a third inductor including a third loop that has more than at least one inductor loop.

In an embodiment, the excitation element may be positioned adjacent to the first receiver sensor, and the first receiver sensor is positioned between the second receiver sensor and the excitation element.

those skilled in the art will appreciate that an embodiment of a sensor for detecting a target object may comprise:

an excitation element configured to receive an a.c. signal from a sensor circuit and form a magnetic field;

a first receiver sensor, such as for example sensor 18, configured to have a first mutual inductance with the excitation element, the first receiver sensor including a first loop, such as for example loop 22, that is wound in a first direction and having a second loop, such as for example loop 21, that is wound in a second direction that is substantially opposite to the first direction such that the first mutual inductance is substantially null in an absence of the target object; and a second receiver sensor, such as for example sensor 30, configured to have a second mutual inductance with the excitation element, the second receiver sensor including a third loop, such as for example loop 37, having a first portion, such as for example portion 38, that is wound in a third direction and a second portion, such as for example portion 39, that is wound in a fourth direction that is substantially opposite to the third direction, and including a fourth loop, such as for example loop 34, having a third portion, such as for example portion 36, that is wound in substantially the third direction and a fourth portion, such as for example portion 35, that is wound substantially in the fourth direction such that the second mutual inductance is substantially null in an absence of the target object.

Those skilled in the art will also appreciate that an embodiment of a sensor for detecting a target object may comprise:

an excitation element configured to receive an a.c. signal from a sensor circuit and form a magnetic field;

a first receiver sensor, such as for example sensor 18, may be configured to have a first mutual inductance with the excitation element, the first receiver sensor may include a first loop, such as for example loop 22, that is wound in a first direction, such as for example counter clockwise, and having a second loop, such as for example loop 21, that is wound in a second direction that is substantially opposite to the first direction such that the first mutual inductance is substantially null in the absence of the target object; and a second receiver sensor, such as for example sensor 30, configured to have second mutual inductance with the excitation element, the second receiver sensor including a third loop, such as for example loop 37, having a first portion, for example portion 38, that is wound in a third direction, such as for example a counter clockwise direction, and a second portion, such as for example portion 39, that is wound in a fourth direction that is substantially opposite to the third direction, and including a fourth loop, for example loop 34, having a third portion, such as portion 36 for example, that is wound in substantially the third direction and a fourth portion, such as portion 35 for example, that is wound substantially in the fourth direction such that the second mutual inductance is substantially null in the absence of target the object.

An embodiment may include that the first loop is positioned substantially laterally to the second loop and substantially in a first plane with the second loop.

Another embodiment may include that the first loop has a first mushroom cap shape that is positioned back-to-back with a second mushroom cap shape of the second loop.

In an embodiment, the third loop may be positioned laterally to the fourth loop and in a first plane with the fourth loop.

An embodiment may include that the third loop has a first substantially mushroom cap shaped portion and the fourth loop has a second substantially mushroom cap shape portion, and wherein the third loop has a first substantially half rectangular shaped portion and the fourth loop has a second substantially half rectangle shape portion, and wherein the first and second substantially half rectangular shaped portions are positioned laterally between the first and second substantially mushroom shaped portions.

In an embodiment, the first loop may form a first signal having a first polarity in response to the magnetic field and wherein the second loop is configured to form a second signal having a second polarity that is opposite to the first polarity such that the first and second signals cancel out.

In view of all of the above, it is evident that a novel device and method is disclosed. Included, among other features, is forming a sensor circuit to receive signals from two receiver sensors and to detect movement of a target object and a direction of movement. The sensor circuit may have an adaptable threshold that facilitates determining that the target object has changed direction. An embodiment may also include forming sensor element that have substantially null mutual inductance in the absence of the target object. An embodiment may include forming the inductor elements to have a variable mutual inductance in response to movement of the target object. The sensors may be formed to have symmetrical shapes that assist in improving performance of the system in the presence of noise.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. As will be appreciated by those skilled in the art, the example form of circuit 45 and elements 75 are used as a vehicle to explain the operation method of detecting movement and the direction of the movement of a target object. However other embodiments are possible. Many alternate embodiments are explained hereinbefore.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A device for detecting rotation of an object comprising:
   a semiconductor device having a sensor circuit that includes a signal generator configured to generate an excitation signal;
   a first terminal of the sensor circuit configured to couple the excitation signal to an excitation element wherein the excitation element is configured to be substantially fixed both positionally and rotationally such that the excitation element is non-rotating;
   a first demodulator of the sensor circuit configured to receive the excitation signal and to receive a first receiver signal from a first receiver sensor wherein the first receiver sensor is substantially fixed positionally and rotationally relative to the excitation element and wherein the first receiver signal is representative of a first mutual inductance that is formed between the excitation element and the first receiver sensor, the first demodulator configured to form a first detection signal that is representative of the first mutual inductance;
   a second demodulator of the sensor circuit configured to receive the excitation signal and to receive a second receiver signal from a second receiver sensor wherein the second receiver sensor is substantially fixed positionally and rotationally relative to the excitation element and wherein the second receiver signal is representative of a second mutual inductance that is formed between the excitation element and the second receiver sensor, the second demodulator configured to form a second detection signal that is representative of the second mutual inductance;
   the sensor circuit configured to assert a rotation detected signal responsively to a difference between the first detection signal and a first reference signal; and
   the sensor circuit configured to assert a rotation direction signal responsively to a difference between the second detection signal and an adaptable reference signal.

2. The device of claim 1 further including a first comparator configured to receive the first detection signal and the first reference signal and form the rotation detected signal on an output of the first comparator.

3. The device of claim 2 further including a second comparator configured to receive the second detection signal and the adaptable reference signal and form the rotation direction signal on an output of the second comparator.

4. The device of claim 1 wherein the excitation element has a first geometric shape and the first receiver sensor has a second geometric shape that is substantially a twisted image of the first geometric shape.

5. The device of claim 4 wherein the second receiver sensor has a third geometric shape that is substantially a twisted image of the second geometric shape.

6. The device of claim 1 wherein the first demodulator is configured to remove an a.c. component of the excitation signal from the first receiver signal.

7. The device of claim 6 wherein the signal generator is configured to form an a.c. signal having a frequency that is greater than a first frequency at which the first mutual inductance varies and greater that a second frequency at which the second mutual inductance varies and wherein the a.c. component removed by the first demodulator corresponds the a.c. signal.

8. The device of claim 1 wherein the second demodulator is configured to remove an a.c. component of the excitation signal from the second receiver signal.

9. The device of claim 1 wherein an adaptable reference circuit forms an average signal that is substantially an average value of the second detection signal and forms the adaptable reference signal substantially equal to the average signal.

10. A method of forming a sensor circuit comprising:
    forming the sensor circuit to excite an excitation element with an excitation signal is wherein the excitation element is substantially fixed and non-moving both rotationally and positionally;
    forming the sensor circuit to receive a first receiver signal from a first receiver sensor and form a first detection signal wherein the first detection signal has a magnitude that increases in response to a metal object moving from distal to the first receiver sensor to proximal to a first portion of the first receiver sensor, wherein the magnitude of the first detection signal decreases in response to the metal object moving one of rotationally or substantially tangentially toward substantially a center of the first receiver sensor wherein the first receiver sensor is substantially fixed both rotationally and positionally relative to the excitation element and wherein the metal object moves relative to the excitation element;
    configuring the sensor circuit to assert a rotation detection signal responsively to a first value of the first detection signal;
    forming the sensor circuit to receive a second receiver signal from a second receiver sensor and form a second detection signal wherein the second detection signal has a minimum value in response to the metal object in a position substantially centered to the second receiver sensor, and has a greater value in response to the metal object having a position distal from the center of the second receiver sensor; and configuring the sensor circuit to assert a rotation direction signal responsively to a first value of the second detection signal.

11. The method of claim 10 further including configuring an adaptable reference circuit to form an adaptable reference signal having a value that is a percentage of a difference between the greater value of the second detection signal and the minimum value of the second detection signal wherein the first value of the second detection signal is substantially equal to the value of the adaptable reference signal.

12. The method of claim 10 further including configuring an adaptable reference circuit to form an adaptable reference signal having a value that is an average of a maximum value and the minimum value of the second detection signal wherein the first value of the second detection signal is substantially equal to the value of the adaptable reference signal.

13. The method of claim 10 further including configuring the sensor circuit to form the first detection signal to include a minimum value in response to the metal object in a position substantially centered to the first receiver sensor and in response to the metal object being distal to the first receiver sensor.

14. The method of claim 10 further including configuring the sensor circuit to form the first detection signal to correspond to a mutual inductance formed between the first receiver sensor and an excitation element and to form the second detection signal to correspond to another mutual inductance formed between the second receiver sensor and the excitation element.

15. A sensor circuit comprising:
a first receiver circuit configured to receive a first signal that is representative of a first variable mutual inductance between an excitation element and a first sensor element and form a first detection signal that is representative of the first variable mutual inductance, wherein the first variable mutual inductance varies in response to a position of a metal object and wherein the first sensor element is substantially fixed in position relative to the excitation element so that the excitation element is axially coextensive with the first sensor element and is fixed rotationally with the first sensor element;
a second receiver circuit configured to receive a second signal that is representative of a second variable mutual inductance between the excitation element and a second sensor element and form a second detection signal that is representative of the second variable mutual inductance, wherein the second variable mutual inductance varies in response to the position of the metal object; and
a recognition circuit configured to assert a movement detected signal responsively to a first value of the first detection signal, and configured to assert a movement direction signal responsively to a first value of the second detection signal.

16. The sensor circuit of claim 15 wherein the first detection signal has a minimum value and a maximum value that are offset in phase with respect to a minimum value and a maximum value, respectively, of the second detection signal.

17. The sensor circuit of claim 15 further including a signal generator configured to generate an excitation signal and apply the excitation signal to an excitation element wherein the first variable mutual inductance is formed between the excitation element and a first receiver sensor and wherein the second variable mutual inductance is formed between the excitation element and a second receiver sensor.

18. The sensor circuit of claim 15 wherein the first variable mutual inductance is formed between an excitation element having a first inductor including at least one inductor loop and a first receiver sensor having a second inductor including a second loop that has more than at least one inductor loop; and
the second variable mutual inductance formed between the excitation element and a second receiver sensor having a third inductor including a third loop that has more than at least one inductor loop.

19. The sensor circuit of claim 15 wherein the excitation element is fixedly positioned adjacent to the first receiver sensor, and the first receiver sensor is fixedly positioned between the second receiver sensor and the excitation element.

20. A sensor for detecting a target object comprising:
an excitation element configured to receive an a.c. signal from a sensor circuit and form a magnetic field;
a first receiver sensor configured to have a first mutual inductance with the excitation element, the first receiver sensor including a first loop that is wound in a first direction and having a second loop that is wound in a second direction that is substantially opposite to the first direction such that the first mutual inductance is substantially null in an absence of the target object wherein first receiver sensor is configured to be placed in a substantially fixed position relative to the excitation element; and
a second receiver sensor configured to have a second mutual inductance with the excitation element, the second receiver sensor including a third loop having a first portion that is wound in a third direction and a second portion that is wound in a fourth direction that is substantially opposite to the third direction, and including a fourth loop having a third portion that is wound in substantially the third direction and a fourth portion that is wound substantially in the fourth direction such that the second mutual inductance is substantially null in an absence of the target object wherein the second receiver sensor is configured to be placed in a substantially fixed position relative to the excitation element and to the first receiver sensor such that a point on a periphery of the excitation element is fixed positionally relative to the first, second, third, and fourth loops.

* * * * *